United States Patent
Shionoiri

(10) Patent No.: US 8,994,430 B2
(45) Date of Patent: Mar. 31, 2015

(54) SEMICONDUCTOR DEVICE

(71) Applicant: Semiconductor Energy Laboratory Co., Ltd., Atsugi-shi, Kanagawa-ken (JP)

(72) Inventor: Yutaka Shionoiri, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/276,018

(22) Filed: May 13, 2014

(65) Prior Publication Data

US 2014/0340134 A1 Nov. 20, 2014

(30) Foreign Application Priority Data

May 17, 2013 (JP) ................................. 2013-104626

(51) Int. Cl.
*H03K 3/356* (2006.01)
*H03K 3/037* (2006.01)

(52) U.S. Cl.
CPC ................... *H03K 3/0375* (2013.01)
USPC .......................... 327/208; 327/210; 327/218

(58) Field of Classification Search
USPC ......... 327/199, 202, 203, 208, 210–212, 214, 327/215, 217, 218, 219
See application file for complete search history.

(56) References Cited

U.S. PATENT DOCUMENTS

| | | | |
|---|---|---|---|
| 7,123,068 B1 * | 10/2006 | Hoover et al. | 327/202 |
| 8,421,068 B2 | 4/2013 | Yamazaki et al. | |
| 8,446,171 B2 | 5/2013 | Takahashi | |
| 8,547,771 B2 | 10/2013 | Koyama | |
| 2013/0021078 A1 * | 1/2013 | Elkin et al. | 327/218 |
| 2013/0191673 A1 | 7/2013 | Koyama et al. | |
| 2013/0193434 A1 | 8/2013 | Yamazaki et al. | |
| 2014/0097867 A1 | 4/2014 | Koyama | |

OTHER PUBLICATIONS

Yuji Kunitake et al.; "Possibilities to Miss Predicting Timing Errors in Canary Flip-flops"; Proc. 54th IEEE International Midwest Symposium on Circuits and Systems(MWSCAS); 2011; Mp2E-1 (4 pages).

Shidhartha Das et al.; "A Self-Tuning DVS Processor Using Delay-Error Detection and Correction"; Symposium on VLSI Circuits Digest of Technical Papers; Jun. 2005; pp. 258-261 (4 pages).

* cited by examiner

*Primary Examiner* — Long Nguyen
(74) *Attorney, Agent, or Firm* — Fish & Richardson P.C.

(57) ABSTRACT

To reduce power consumption of a circuit (TEDC) which detects timing errors in a main flip-flop by determining whether or not output data signals of the main flip-flop and a shadow flip-flop correspond. The TEDC includes a power gating circuit (PGC) which performs power gating of the shadow FF and a reset circuit (RSTC) which resets an output signal of the shadow FF. The PGC makes the shadow FF in an active mode only when error detection needs to be performed; other than that, the PGC makes the shadow FF in a power saving mode. The RSTC supplies a certain voltage to an output terminal of the shadow FF in the power saving mode to suppress malfunction of the TEDC. A transistor using an oxide semiconductor is used to supply the voltage to the output terminal.

14 Claims, 11 Drawing Sheets

FIG. 1
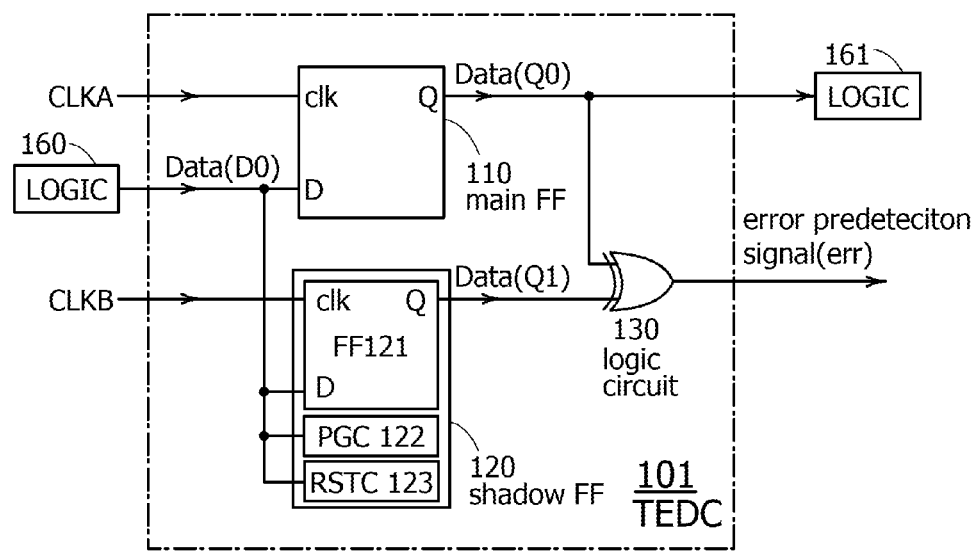
FIG. 2A
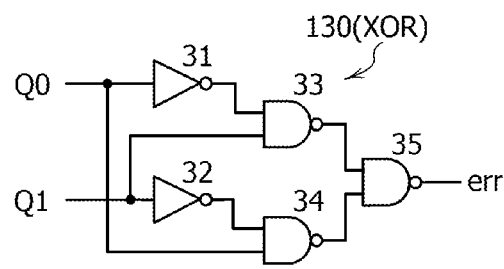
FIG. 2B
| Q0 | Q1 | err |
|----|----|-----|
| 0  | 0  | 0   |
| 0  | 1  | 1   |
| 1  | 0  | 1   |
| 1  | 1  | 0   |

SEMICONDUCTOR DEVICE

BACKGROUND OF THE INVENTION

1. Field of the Invention

The present invention relates to a semiconductor device, a driving method of the semiconductor device, and the like. In particular, the present invention relates to a semiconductor device having a function of detecting timing errors of a circuit, a driving method of the semiconductor device, and the like.

Note that in this specification, a semiconductor device means a circuit including a semiconductor element (e.g., a transistor or a diode) and a device including the circuit. The semiconductor device also means any device that can function by utilizing semiconductor characteristics. For example, an integrated circuit, a chip having an integrated circuit, a display device, a light-emitting device, a lighting device, and an electronic device are all semiconductor devices.

2. Description of the Related Art

A flip-flop (abbreviated as FF) is a kind of logic circuit, which is a memory circuit that stores one-bit data as "0" or "1". An FF is a component circuit composing a register of a processor such as a central processing unit (CPU) and a microprocessor unit (MPU). Thus, when timing errors occur in an FF, problems such as a change of results of arithmetic operation by a processor and an increase in power consumption, which might cause malfunction of the processor.

A timing error in an FF is a phenomenon in which the timing of inputting a clock signal or a data signal is off and consequently incorrect values are read and written. In general, timing errors can be detected and removed by simulation in the design phase. However, miniaturization of processors causes an increase of the influence by dynamic factors such as heat and manufacturing variation and consequently it is difficult to remove all timing errors in the design phase.

In view of the above, a circuit to detect timing errors when an FF is operated and correct the errors has been developed; there are a canary FF (Non-Patent Document 1), a razor FF (Non-Patent Document 2), and the like.

REFERENCE

Non-Patent Document

[Non-Patent Document 1]
Y. Kunitake et al., "Possibilities to Miss Predicting Timing Errors in Canary *Flip-Flops*", Proc. 54*th IEEE International Midwest Symposium on Circuits and Systems* (MWSCAS) 2011, Mp2E-1

[Non-Patent Document 2]
Das, S. et al., "A self-tuning DVS processor using delay-error detection and correction", *Dig. Tech. Pap. Symp. VLSI Circuits*, June 2005, pp. 258-261

SUMMARY OF THE INVENTION

Basically, two FF are used in each of the timing error detection circuits in Non-Patent Document 1 and Non-Patent Document 2. A signal path of one FF is a regular data signal path, and the other FF is a signal path for error detection. By comparing data signal output from the two FF, timing errors are detected. When timing errors are detected, a data signal transferred to the regular signal path is corrected. The FF used to detect errors is referred to as a shadow FF.

The shadow FF is desirably operated only in error detection. However, in the error detection techniques in Non-Patent Document 1 and Non-Patent Document 2, power is always supplied to the shadow FF. Consequently, power consumption of the processor is increased.

An object of one embodiment of the present invention is to reduce power consumption of a memory circuit such as a flip-flop (FF). Another object of one embodiment of the present invention is to reduce power consumption of a semiconductor device having a function of detecting timing errors.

Note that the description of a plurality of objects does not mutually preclude the existence. Note that one embodiment of the present invention does not necessarily achieve all the objects listed above. Objects other than those listed above are apparent from the description of the specification, drawings, and claims, and also such objects could be an object of one embodiment of the present invention.

An embodiment of the present invention is a semiconductor device includes a flip-flop, a power gating circuit for switching the flip-flop between an active state and a non-active state in accordance with the data signal, and a reset circuit having a function of supplying a first power supply voltage to the output terminal when the flip-flop is in the non-active state. The flip-flop includes a clock input terminal, an input terminal to which a data signal is input, and an output terminal The reset circuit includes first transistor connecting the first output terminal to a wiring through which the first power supply voltage is supplied. The first transistor is turned on and off in accordance with the data signal. The off-state current of the first transistor per micrometer of channel width at room temperature is 10 zA or lower.

Another embodiment of the present invention is a semiconductor device including a first flip-flop, a second flip-flop, a detection circuit which determines whether or not an output signal from the first output terminal corresponds to an output signal from the second output terminal and generates an error prediction signal, a power gating circuit for switching the second flip-flop between an active state and a non-active state of in accordance with a first data signal, and a reset circuit having a function of supplying a first power supply voltage to the second output terminal when the second flip-flop is in the non-active state. The first flip-flop includes a first clock input terminal to which a first clock signal is input, a first input terminal to which the first data signal is input, and a first output terminal. The second flip-flop includes a second clock input terminal having the same frequency as the first clock signal and a phase different from the first clock signal, a second input terminal to which the first data signal is input, and a second output terminal. The reset circuit includes a first transistor connecting the second output terminal and a wiring through which the first power supply voltage is supplied. The first transistor is turned on and off in accordance with the first data signal. A channel of the first transistor is formed using an oxide semiconductor.

According to one embodiment of the present invention, power consumption of a memory circuit such as a flip-flop (FF) can be reduced. According to one embodiment of the present invention, power consumption of a semiconductor device having a function of detecting timing errors can be reduced.

BRIEF DESCRIPTION OF THE DRAWINGS

FIG. 1 is a block diagram illustrating a structure example of an error detection circuit (TEDC).

FIG. 2A is circuit diagram illustrating a structure example of a logic circuit which generates an error prediction signal (err). FIG. 2B is a truth table of the logic circuit.

DETAILED DESCRIPTION OF THE INVENTION

Figure 3A:
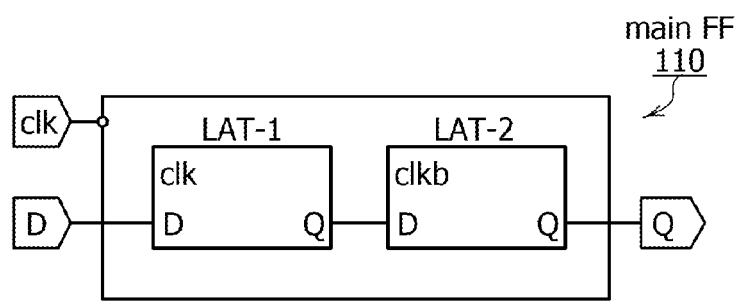
FIG. 3A is a block diagram illustrating a structure example of a main FF.

Hereinafter, embodiments of the present invention will be described in detail with reference to the accompanying drawings. It will be readily appreciated by those skilled in the art that modes and details of the present invention can be changed in various ways without departing from the spirit and scope of the present invention. Therefore, the present invention should not be construed as being limited to the description of the embodiments below.

In the drawings used for the description of embodiments of the present invention, the same portions or portions having a similar function are denoted by the same reference numerals, and the repeated description thereof is omitted.

(Embodiment 1)

A semiconductor device of this embodiment will be described with reference to FIG. 1, FIGS. 2A and 2B, FIGS. 3A and 3B, FIGS. 4A to 4C, FIG. 5, and FIG. 6. In this embodiment, an FF used in an error detection circuit and the error detection circuit are described as examples of a semiconductor device.

<Structure Example 1 of Error Detection Circuit (TEDC)>

FIG. 1 is a block diagram illustrating a structure example of an error detection circuit (TEDC). An error detection circuit (TEDC) 101 includes a main flip-flop (main FF) 110, a shadow flip-flop (shadow FF) 120, and a logic circuit 130.

The main FF 110 is an FF functioning as a general memory circuit. In the example of FIG. 1, the main FF 110 stores output data (D0) of a logic circuit 160 and outputs stored data (Q0) to a logic circuit 161. The shadow FF 120 is a flip-flop used to detect timing errors of the data signal D0 that is input to the main FF 110.

A clock signal CLKA is used as a regular clock signal. A clock signal CLKB is used to detect errors. The signal CLKB oscillates with the same frequency as the clock signal CLKA; however, the phase of the signal CLKB is delayed for a certain period (amount) with respect to the signal CLKA.

Here, the TEDC 101 is used to detect delay of the data signal D0. The signal CLKB is a clock signal in which the signal CLKA is delayed. The amount of delay of the phase of the signal CLKB is an acceptable length of time to delay the data signal Q0.

Note that in this specification, the clock signal CLKA is sometimes referred to as signal CLKA, CLKA, and the like. The same can be applied to other signals, voltage, and circuits.

The logic circuit 130 has a function of determining whether or not these signals correspond by comparing two input signals and outputs the result as an error prediction signal err.

In the example of FIG. 1, the logic circuit 130 is a XOR gate circuit. When the values of two signals input to the logic circuit 130 do not correspond, the signal err becomes at high level (H level); when they corresponds, the signal err becomes at low level (L level).

FIG. 2A is a structure example of the logic circuit 130 which is an XOR circuit. FIG. 2B is a truth table of the logic circuit 130 (XOR). The logic circuit 130 is composed of two inverters (31 and 32) and three NAND gate circuits (33-35). Needless to say, the logic circuit 130 is not limited to the XOR gate circuit.

The shadow FF 120 needs to be operated when the data signal D0 has timing errors. However, when the data signal D0 does not have timing errors, the shadow FF 120 is unnecessary for the operation of the main FF 110.

In view of the above, in this embodiment, to operate the shadow FF 120 only when necessary and reduce power consumed in the TEDC 101, power gating is performed in the shadow FF 120 using the data signal D0 output from the logic circuit 160 in the preceding stage of the main FF 110. Specifically, in addition to the flip-flop (FF) 121, a power gating circuit (PGC) 122 and a reset circuit (RSTC) 123 are provided in the shadow FF 120. The FF 121 has the same circuit configuration as that of the main FF 110.

The PGC 122 is used to supply and stop a power supply voltage to the FF 121 in accordance with the data signal D0. Power gating by the PGC 122 switches the operation mode of the FF 121 between an active state and a non-active state (a power saving state).

The RSTC 123 has a function of resetting the FF 121. The RSTC 123 is used to reset an output data signal Q1 of the FF 121 in accordance with the data signal D0.

In this embodiment, the TEDC 101 is used to detect rising delay of the data signal D0. Thus, to reduce the power consumed in the shadow FF 120, when the data signal D0 is at H level, the shadow FF 120 becomes active to make the shadow FF 120 function as a flip-flop; and when the signal D0 is at L level, the shadow FF 120 is inactive. By operating the shadow FF 120 in the above manner, the PGC 122 performs power gating and the RSTC 123 performs reset operation in response to rising delay and falling delay of the signal D0.

<Structure Example and Operation Example of Shadow FF>

The structure and operation of the shadow FF 120 will be described with reference to FIGS. 3A and 3B.

Figure 3B:
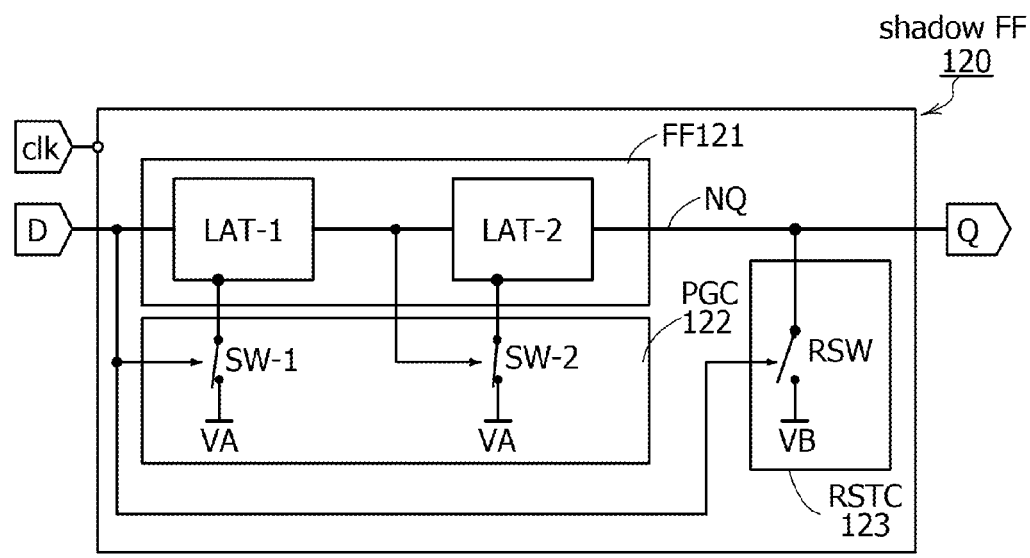
FIG. 3B is a block diagram illustrating a structure example of a shadow FF.

FIGS. 3A and 3B are block diagrams showing structure examples of the main FF 110 and the shadow FF 120, respectively. Described here is the structure and the operation of the shadow FF 120 in which the main FF 110 includes two latches (LAT-1 and LAT-2) connected in cascade (see FIG. 3A).

As shown in FIG. 3B, the FF 121 includes two latches (LAT-1 and LAT-2) similarly to the main FF 110. The PGC 122 includes power gating switches (SW-1 and SW-2) to supply and stop a power supply voltage to the LAT-1 and the LAT-2 . The SW-1 connects the LAT-1 and a wiring through which a power supply voltage VA. The SW-2 connects the LAT-2 and the wiring. When the SW-1 and the SW-2 are turned on, the voltage VA is supplied to the LAT-1 and the LAT-2, whereby the FF 121 becomes active to serve as a normal flip-flop.

The on/off state of the SW-1 is controlled by a signal input from an input terminal D of the shadow FF 120. The on/off state of the SW-2 is controlled by a signal transferred from the LAT-1. Here, the SW-1 and the SW-2 are turned on when the input signal is at H level (data value is 1). With such a structure, when the data signal D0 is at H level, the FF 121 is supplied with the power supply voltage VA to be active. When the signal is at L level, the supply of the power supply voltage VA is stopped and consequently the FF 121 becomes in a non-active state. Accordingly, when the data signal D0 changes from L level to H level, the PGC 122 starts power supply to the FF 121; when the data signal D0 changes from H level to L level, the PGC 122 stops power supply to the FF 121.

When the FF 121 is in a non-active state, the voltage of an output node NQ of the FF 121 (shadow FF 120) becomes unstable, leading to malfunction of the TEDC 101 and the processor including the TEDC 101. Thus, when the FF 121 is in non-active state, the RSTC 123 performs reset operation to reset the voltage of the output node NQ to a set value.

The RSTC 123 includes a switch RSW turned on and off in accordance with the signal input from the terminal D. The switch RSW connects the node NQ (output terminal Q) and a wiring through which a power supply voltage VB is supplied. The switch RSW is turned off when the switches of the PGC 122 (SW-1 and SW-2) are on, and is turned on when the switches are off. Accordingly, when the data single D0 input from the terminal D is at L level, the switch RSW is turned on and reset operation is performed in the RSTC 123.

Reset operation is performed when the data single D0 is at L level and consequently the voltage of the node NQ becomes L level by the reset operation. Thus, the voltage VB is a low power supply voltage corresponding to data value "0".

As described above, in a period during which the data signal D0 is at H level, the shadow FF 120 serves as a normal flip-flop. The FF 121 transfers the data signal D0 from the terminal D to the terminal Q in accordance with the signal CLKB. In a period during which the data signal D0 is at L level, the shadow FF 120 is in a power saving mode (standby mode). Here, the FF 121 becomes inactive and stops operating and consequently the RSTC 123 outputs the L-level signal to the terminal Q.

In the TEDC 101, the shadow FF 120 can be active only when delay needs to be detected; the shadow FF 120 can be inactive when delay does not need to be detected. Thus, power consumption in the whole TEDC 101 can be reduced without impairing the error detection function.

Figure 4A:
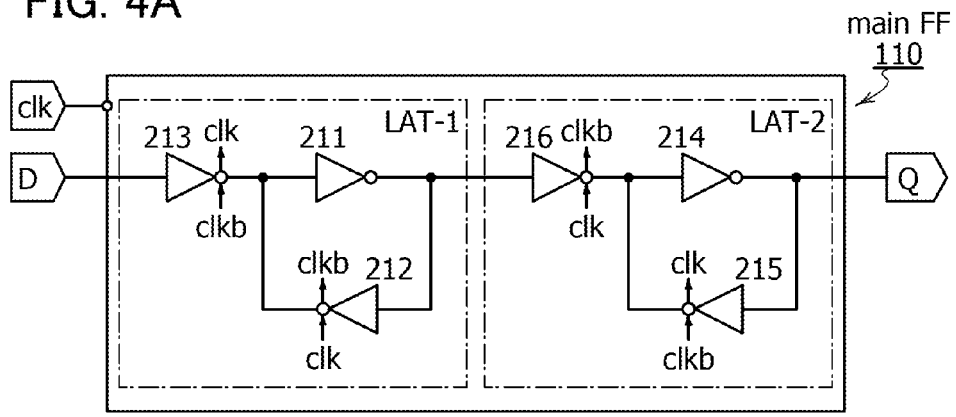
FIG. 4A is a circuit diagram illustrating a structure example of a main FF.
Figure 4B:
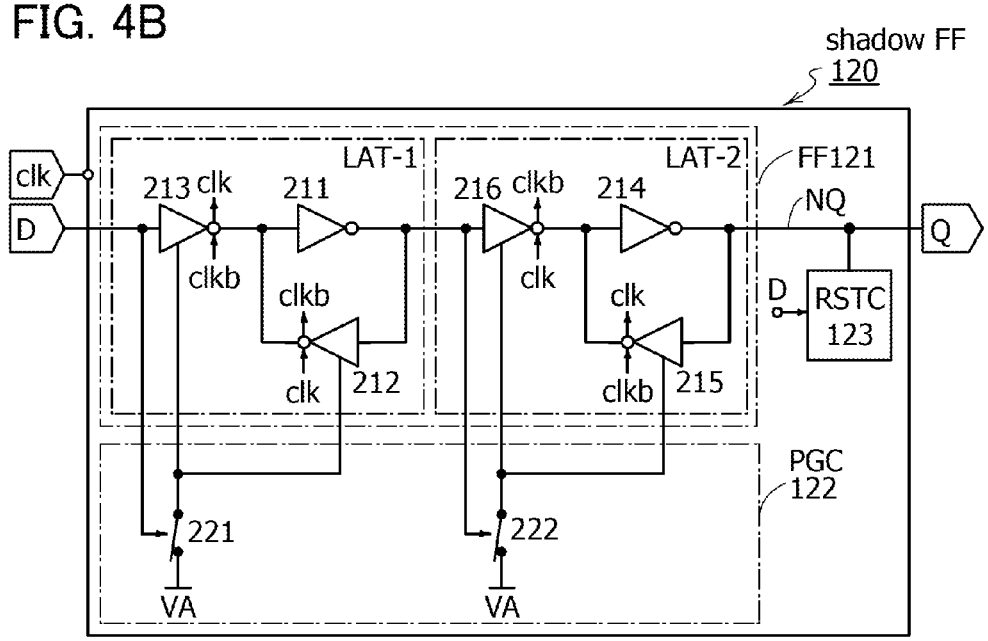
FIG. 4B is a circuit diagram illustrating a structure example of a shadow FF.
Figure 4C:
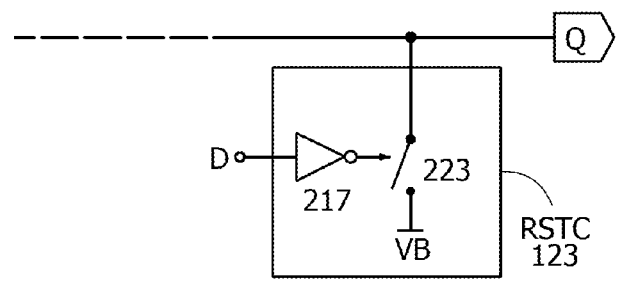
FIG. 4C is a circuit diagram illustrating a structure example of a reset circuit (RSTC).

Hereinafter, examples of circuit configuration of the main FF 110 and the shadow FF 120 are described with reference to FIGS. 4A to 4C. FIG. 4A is a circuit diagram illustrating a structure example of the main FF 110, which corresponds to the block diagram of FIG. 3A. FIG. 4B is a circuit diagram illustrating a structure example of the shadow FF 120, which corresponds to the block diagram of FIG. 3B. FIG. 4C is a circuit diagram illustrating a structure example of the RSTC 123.

<<Structure Example of Main FF>>

The main FF 110 is composed of, for example, two latches (LAT-1 and LAT-2). The LAT-1 on the input side and the LAT-2 on the output side are referred to as a master latch and a slave latch, respectively. In the example of FIG. 4A, the LAT-1 includes an inverter 211, a clocked inverter 212, and a clocked inverter 213. The LAT-2 has a structure similar to that of the LAT-1; the LAT-2 includes an inverter 214, a clocked inverter 215, and a clocked inverter 216.

<<Structure Example of Shadow FF>>

As shown in FIG. 4B, the FF 121 has a circuit structure similar to that of the main FF 110. Needless to say, the main FF 110 and the FF 121 are not limited to the circuit of FIG. 4A as long as they have a function as a flip-flop.

<Structure Example of PGC>

The PGC 122 includes a switch 221 used to control the supply of the power supply voltage VA to the clocked inverters 212 and 213 of the LAT-1 and a switch 222 used to control the supply of the power supply voltage VA to the clocked inverters 215 and 216 of the LAT-2. A switch used for power gating may be provided with each of the clocked inverters 212, 213, 215, and 216. The power gating switch may be provided with a logic circuit (e.g., a clocked inverter) having a function of a switch in the FF 121.

<Structure Example of RSTC>

As shown in FIG. 4C, the RSTC 123 includes an inverter 217 and a switch 223. The switch 223 corresponds to the switch RSW in FIG. 3A, which is turned on when a signal output from the inverter 217 is at H level and is turned off when the signal is at L level. Thus, when the data signal D0 changes from H level to L level, the switch 223 is turned on and the voltage of the node NQ is fixed at VB.

Figure 5:
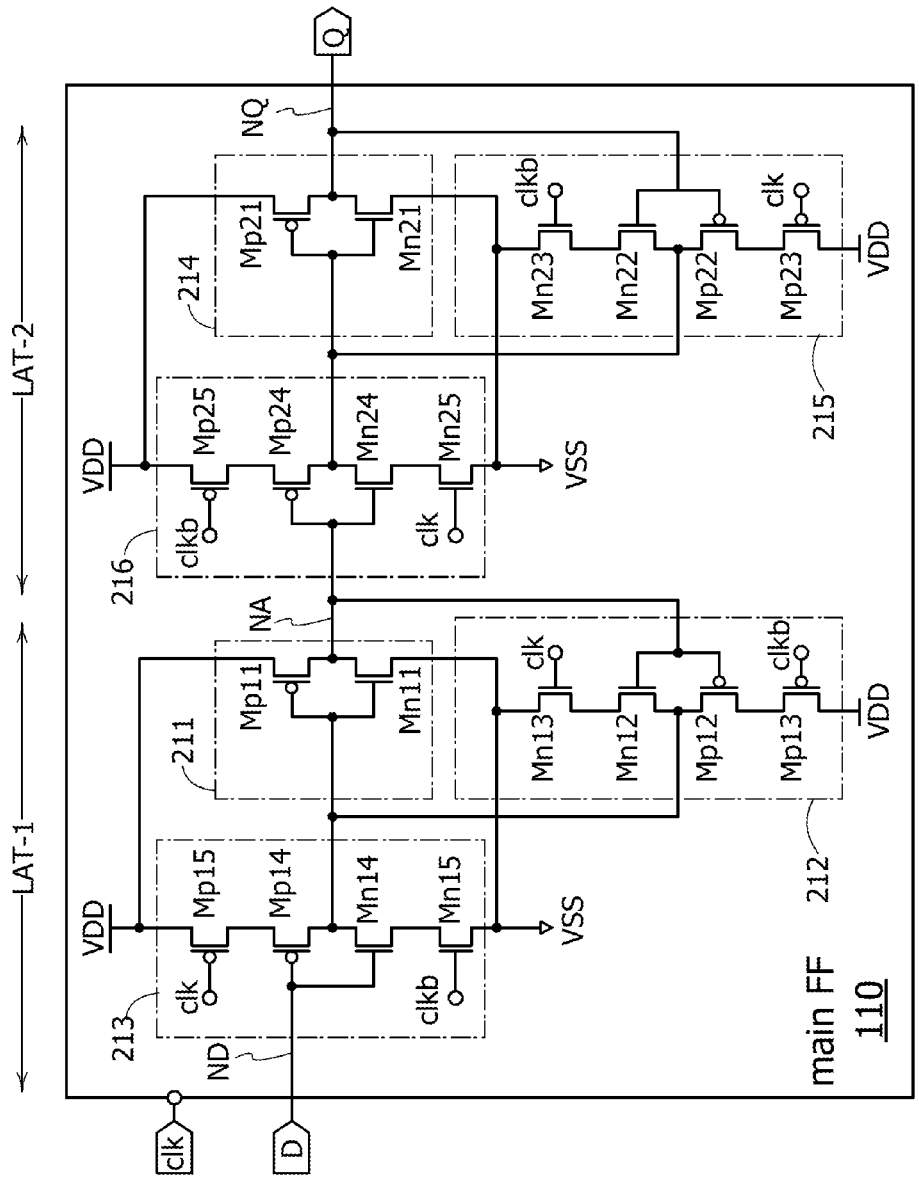
FIG. 5 is a circuit diagram of a main FF corresponding to FIG. 4A.
Figure 6:
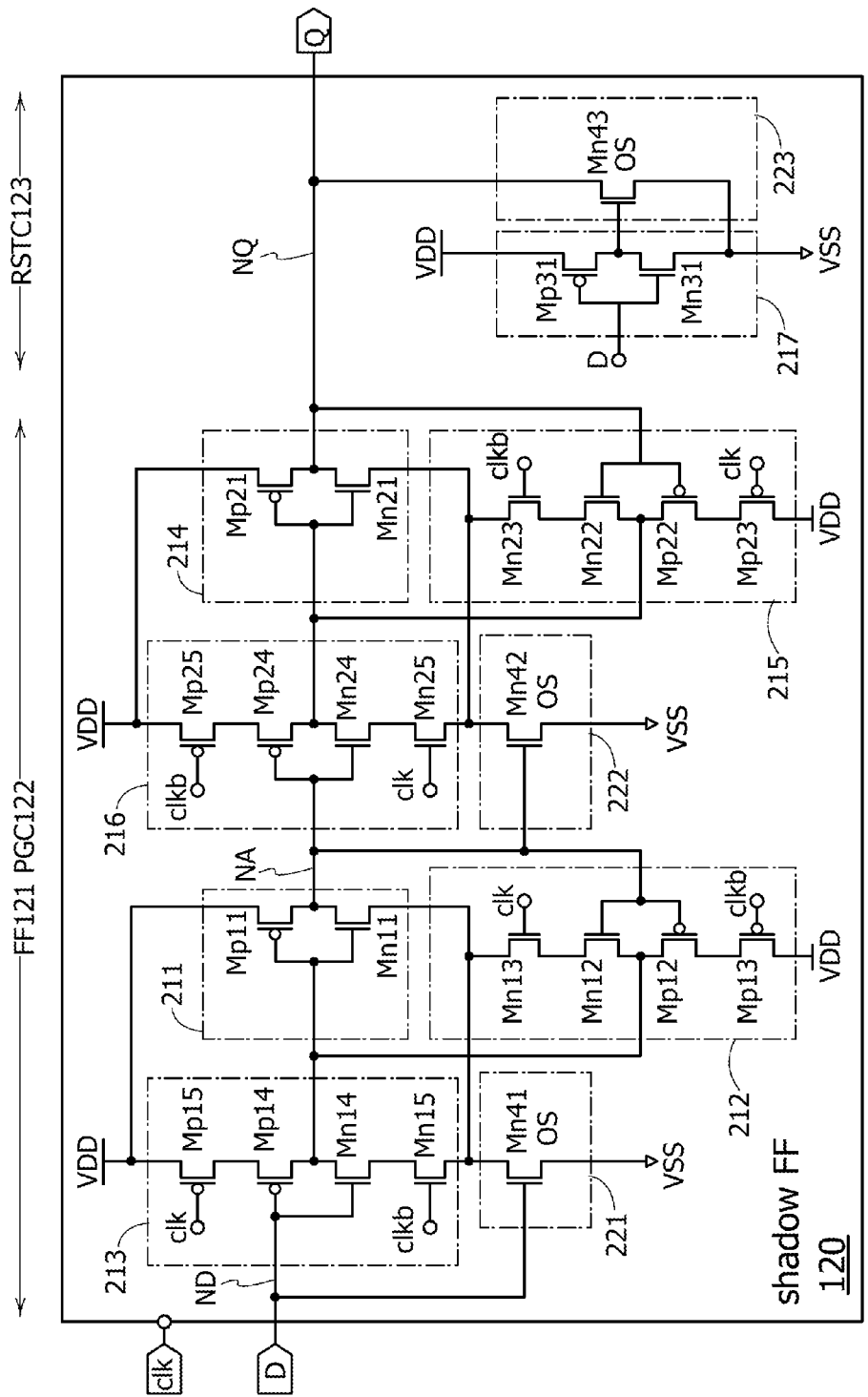
FIG. 6 is a circuit diagram of a shadow FF corresponding to FIG. 4B.

Hereinafter, specific circuit configurations of the main FF 110 and the shadow FF 120 are described with reference to FIG. 5 and FIG. 6. FIG. 5 is a circuit diagram illustrating a structure example of the main FF 110, which corresponds to the circuit diagram of FIG. 4A. FIG. 6 is a circuit diagram illustrating a structure example of the shadow FF 120, which corresponds to the circuit diagram of FIG. 4B.

<<Structure Example of Main FF>>

As shown in FIG. 5, the main FF 110 is supplied with a voltage VDD as a high power supply voltage and a voltage VSS as a low power supply voltage. VSS can be a ground potential (GND).

A node ND is an input node of the main FF 110 (LAT-1). The node NQ is an output node of the main FF 110 (LAT-2). A node NA is an output node of the LAT-1 and also an input node of the LAT-2.

The latch LAT-1 is composed of ten transistors (Mp11-Mp15 and Mn11-Mn15). The inverter 211 is composed of two transistors (Mp11 and Mn11). The clocked inverter 212 is composed of four transistors (Mp12, Mp13, Mn12, and Mn13). The clocked inverter 213 is composed of four transistors (Mp14, Mp15, Mn14, and Mn15).

The latch LAT-2 is composed of ten transistors (Mp21-Mp25 and Mn21-Mn25). The inverter 214 is composed of two transistors (Mp21 and Mn21). The clocked inverter 215 is composed of four transistors (Mp22, Mp23, Mn22, and Mn23). The clocked inverter 216 is composed of four transistors (Mp24, Mp25, Mn24, and Mn25).

Note that an inverted signal of a clock signal input from a clock signal input terminal (elk) is generated by an inverter which is provided in the main FF 110.

<Structure Example of Shadow FF>

As shown in FIG. 6, the shadow FF 120 further includes five transistors (Mp31, Mn31, and Mn41-Mn43) in addition to the main FF 11. With these transistors, the PGC 122 and RSTC 123 are formed.

The PGC 122 includes the transistors Mn41 and Mn42. The switch 221 is composed of the transistor Mn41. A gate of the transistor Mn41 is connected to the input node ND (input terminal D), a source thereof is connected to a wiring through which VSS is supplied, and a drain thereof is connected to each source of the transistors Mn13 and Mn15. The switch 222 is composed of the transistor Mn42. A gate of the transistor Mn42 is connected to the node NA, a source thereof is connected to a wiring through which VSS is supplied, and a drain thereof is connected to each source of the transistors Mn23 and Mn25.

The RSTC 123 includes three transistors (Mp31, Mn31, and Mn43). The inverter 217 is composed of two transistors (Mp31 and Mn31). The switch 223 is composed of the transistor Mn43. A gate of the transistor Mn43 is connected to an output of the inverter 217, a source thereof is connected to a wiring through which VSS is supplied, and a drain thereof is connected to the node NQ.

When the node ND becomes at H level, the transistors (Mn41 and Mn42) included in the PGC 122 are turned on and the transistor Mn43 included in the RSTC 123 is turned off; thus, the shadow FF 120 operates as a normal flip-flop as the main FF 110.

When the node ND becomes at L level, the transistors (Mn41 and Mn42) of the PGC 122 are turned off and the transistor Mn43 of the RSTC 123 is turned on. In this state, supply of VSS to the clocked inverters (212, 213, 215, and 216) is stopped; thus, the shadow FF 120 stops functioning as a flip-flop. By the operation of the RSTC 123, VSS is supplied to the node NQ to be kept at L level.

The data value of an output data Q1 of the shadow FF 120 is determined depending on the voltage level of the node NQ. When the shadow FF 120 functions as a flip-flop (is active), the transistor Mn43 is off. Thus, to suppress the change in voltage of the node NQ when the shadow FF 120 is active, a transistor having small leakage current in an off state (off-state current) is preferably used as the transistor Mn43.

Further, a transistor having small off-state current is preferably used as the transistors Mn41 and Mn42 included in the PGC 122. This is because power consumption in the PGC 122 due to leakage current can be suppressed in a non-active state (standby state).

In this specification, a low off-state current means that an off-state current per micrometer in channel width at room temperature is lower than or equal to 10 zA (zeptoampere). Since the off-state current of the transistor Mn43 is preferably as low as possible, the normalized off-state current is preferably lower than or equal to 1 zA, more preferably lower than or equal to 10 yA (yoctoampere), still more preferably lower than or equal to 1 yA.

An example of a transistor having such low off-state current is a transistor including an oxide semiconductor in a channel. In this specification, a transistor including an oxide semiconductor in a channel is referred to as an OS transistor.

In the TEDC 101, the transistor Mn41 is an OS transistor and others are transistors in which channels are formed using single crystal silicon. Alternatively, in the TEDC 101, the transistors Mn41-Mn43 are OS transistors and others are transistors in which channels are formed using single crystal silicon. Note that a transistor having a channel formed of silicon is referred to as a Si transistor.

<<Operation Example of TEDC>>

Figure 7:
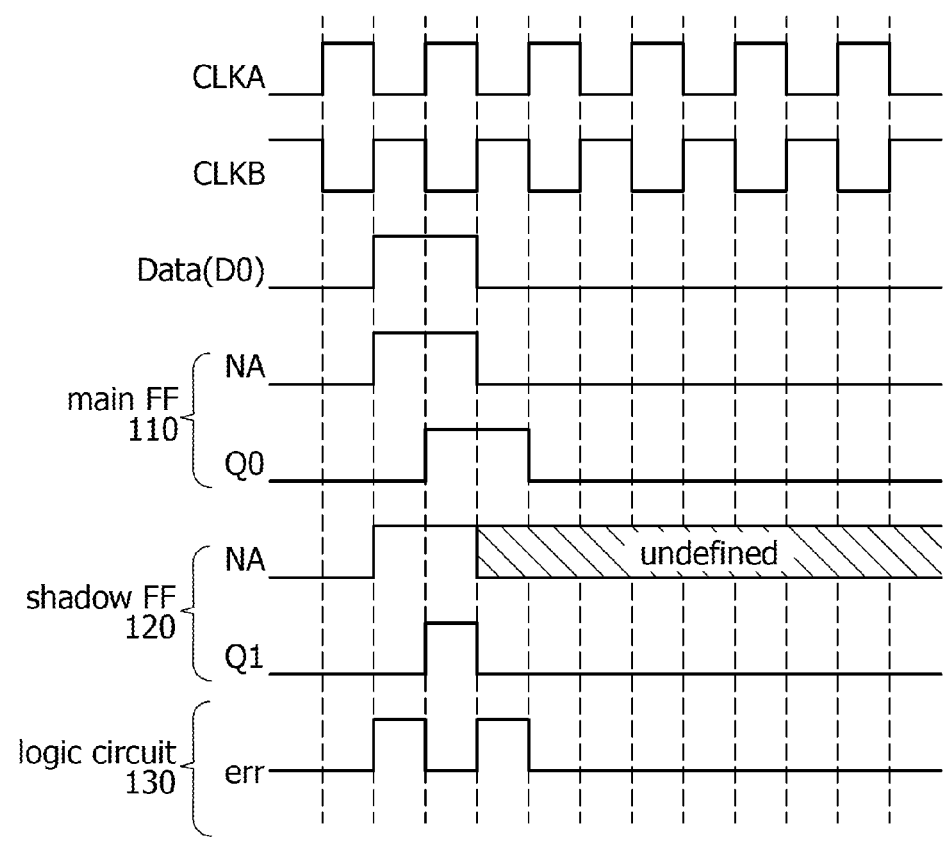
FIG. 7 is a timing chart showing an example of operation of the TEDC in FIG. 1.

Hereinafter, an example of an operation method of the TEDC 101 is described using a timing chart of FIG. 7. FIG. 7 is a timing chart when the circuit of FIG. 5 is used for the main FF 110 and the circuit of FIG. 6 is used for the shadow FF 120.

In the shadow FF 120, when Data becomes at L level, the PGC 122 stops supplying power to the FF 121 and consequently the node NA of the FF 121 becomes undefined. However, there is no particular problem with the operation of the TEDC 101. This is because the CLKB is at L level when the node NA is undefined, the slave latch (LAT-2) performs data latch operation, and the output node NQ of the FF 121 surely becomes at L level by the transistor Mn43. Because the transistor Mn43 is an OS transistor to considerably reduce the leakage current of the transistor Mn43, a conduction path between the output node NQ and the wiring through which the low power supply voltage VSS is supplied can be cut in a period during which the output Q1 is at H level.

The error prediction signal err is generated in the logic circuit 130 by performing XOR operation of the output data signal Q0 of the main FF 110 and the output data Q1 of the shadow FF 120. Because the CLKB is delayed compared to the CLKA in the TEDC 101, the state in which the signal err is oscillated similarly to the CLKA means that there is no rising delay of D0. In other words, the signal err in FIG. 7 shows normal operation of the logic circuit 160 in the preceding stage.

According to this embodiment, an FF having a function of recovering from a standby mode to a normal mode when required can be provided. In addition, by using the FF as a shadow FF, a timing error detection circuit with low power consumption and a conventional error detection function can be provided.

This embodiment can be implemented in appropriate combination with any of the structures described in the other embodiments.

(Embodiment 2)

In this embodiment, another structure example of a timing error detection circuit (TEDC) is described.

<Structure Example 3 of TEDC>

Figure 8:
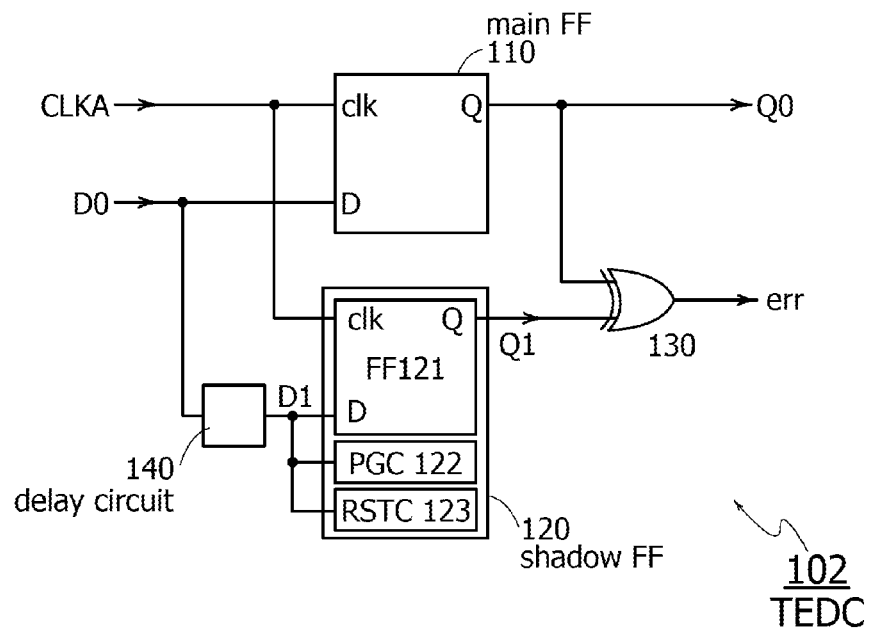
FIG. 8 is a block diagram illustrating a structure example of a TEDC.

FIG. 8 is a block diagram showing a structure example of a TEDC. Similarly to the TEDC 101, the TEDC 102 has a function of detecting rising delay of the data signal D0. The TEDC 102 corresponds to the TEDC 101 in FIG. 1 to which a delay circuit 140 is further added. In the TEDC 102, to detect rising delay of the data signal D0, the delay circuit 140 is placed in an input path of the data signal D0 of the shadow FF 120. The delay circuit 140 delays the data signal D0 for a certain period (amount) and outputs the delayed data signal D1 to the shadow FF 120. Thus, the TEDC 102 can operate only with one clock signal CLKA. Furthermore, the amount of delay of the data signal D0 is changed by the delay circuit 140 and consequently the timing of error detection in the TEDC 102 can be changed.

<Structure Example 3 of TEDC>

Figure 9:
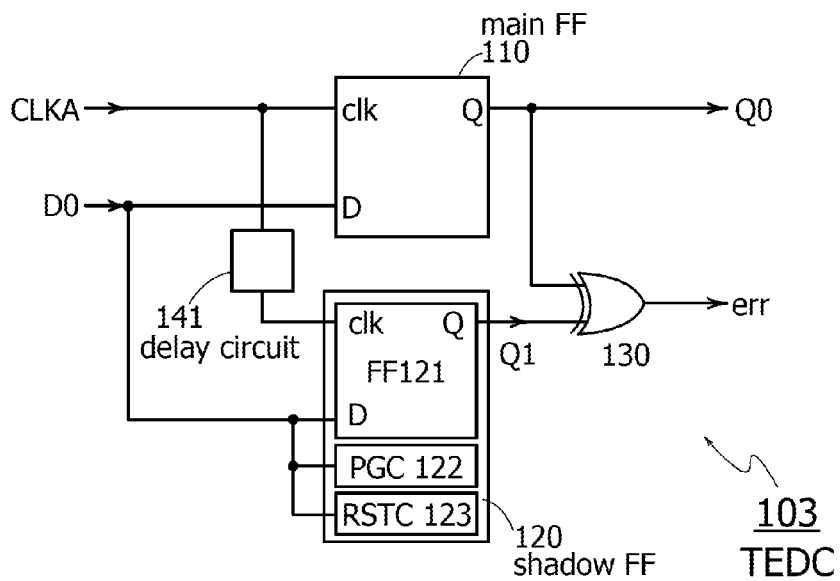
FIG. 9 is a block diagram illustrating a structure example of a TEDC.

Instead of delaying the data signal D0, the clock signal CLKA may be delayed. In this case, for example, a delay circuit 141 is placed in an input path of the clock signal CLKA in the shadow FF 120 similarly to a TEDC 103 of FIG. 9. A delayed clock signal (CLKB in FIG. 1) is generated by the delay circuit 141 and is output to the shadow FF 120.

<Operation Example of TEDC>

The TEDC 103 can be operated in accordance with a timing chart in FIG. 7. Here, the clock signal CLKB is a clock signal delayed by the delay circuit 141.

Figure 10:
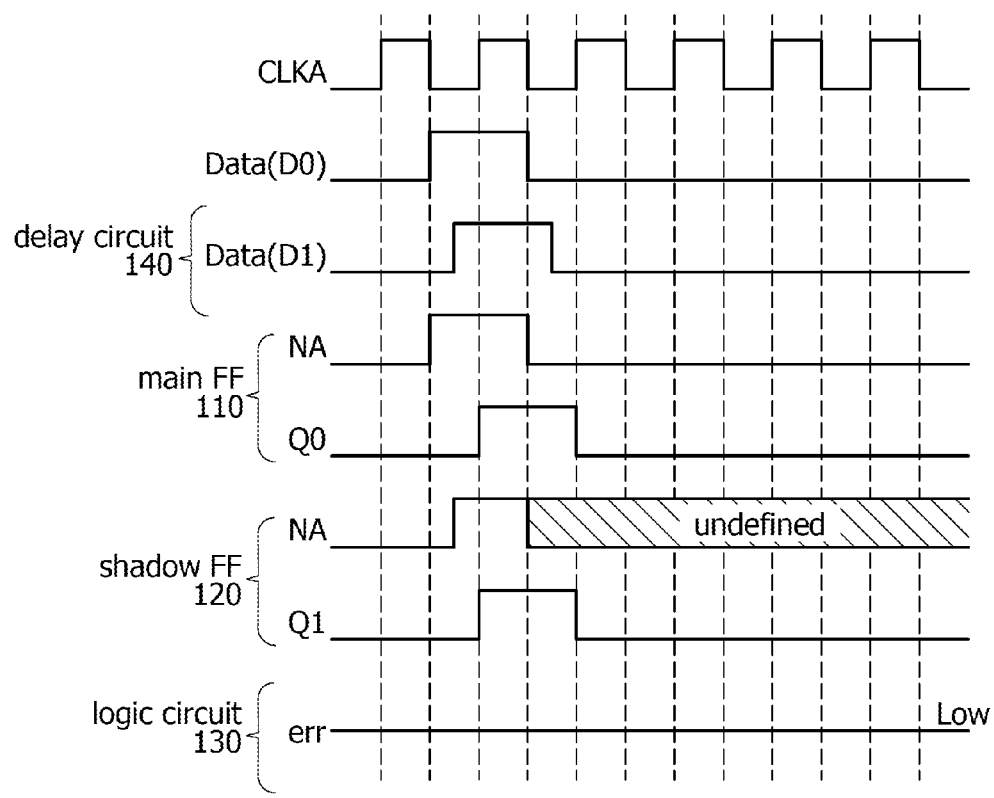
FIG. 10 is a timing chart showing an example of operation of the TEDC in FIG. 8.

Hereinafter, an example of an operation method of the TEDC 102 is described using a timing chart of FIG. 10. FIG. 10 is a timing chart when the circuit of FIG. 5 is used for the main FF 110 and the circuit of FIG. 6 is used for the shadow FF 120.

The delay circuit 140 outputs a data signal D1 that is a data signal D0 delayed by ¼ period of the CLKA. In the shadow FF 120, when D1 becomes at L level, the PGC 122 stops supplying power to the FF 121 and consequently the node NA of the FF 121 becomes undefined. However, there is no particular problem with the operation of the TEDC 102. This is because the CLKA is at L level when the node NA is undefined, the slave latch (LAT-2) performs data latch operation, and the output node NQ of the FF 121 surely becomes at L level by the transistor Mn43.

In the TEDC 102, the delay circuit 140 is placed and the delayed data signal D1 is input to the shadow FF 120. Thus, when rising delay of the data signal D0 input to the main FF 110 is within an allowable range (about ¼ cycle of the CLKA in FIG. 10, for example), the signal err does not change and is kept at L level. The signal err in FIG. 10 shows normal operation of the logic circuit 160 in the preceding stage.

This embodiment can be implemented in appropriate combination with any of the structures described in the other embodiments.

Embodiment 3

In this embodiment, a timing error detection circuit (TEDC) having a data correction function is described. The TEDC in this embodiment includes a data correction circuit (ERCC) that corrects data output to a TEDC in the subsequent stage.

<Structure Example 4 of TEDC>

Figure 11A:
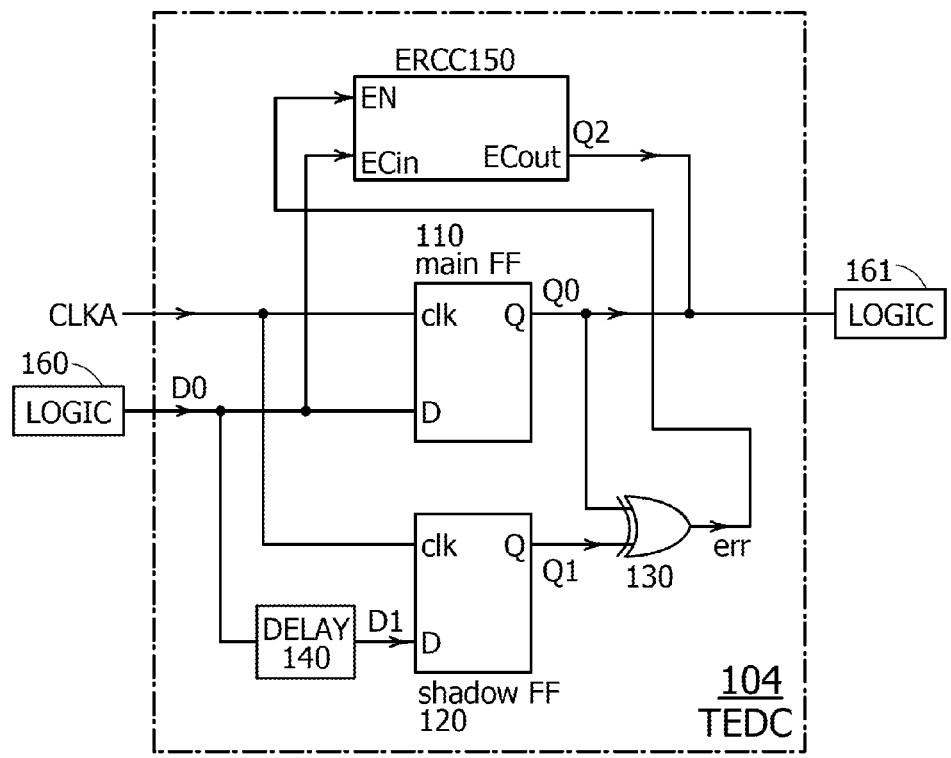
FIG. 11A is a block diagram illustrating a structure example of a TEDC including a data correction circuit (ERCC) which corrects data.
Figure 11B:
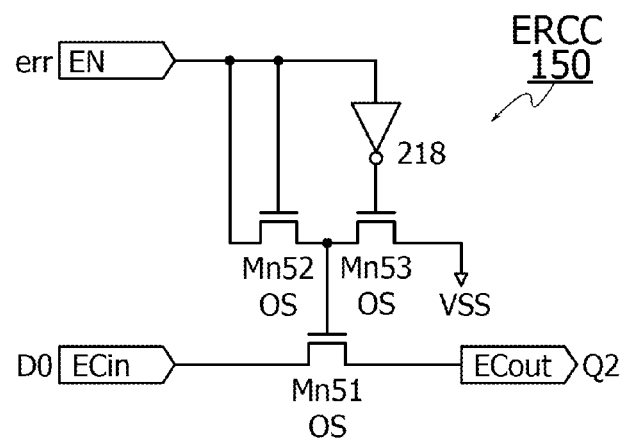
FIG. 11B is a circuit diagram illustrating an example of an ERCC.

FIG. 11A is a block diagram showing a structure example of a TEDC. FIG. 11B is a circuit diagram showing a structure example of an ERCC. As shown in FIG. 11A, a TEDC 104 is a circuit in which a data correction circuit (ERCC) 150 is added to the TEDC 102 shown in FIG. 8.

An error reporting signal err generated in the logic circuit 130 is used as an enable signal of the ERCC 150. As described in Embodiment 2 (see FIG. 8 and FIG. 10), when the data signal D0 is delayed, the signal err becomes at H level. When the signal err at H level is input to the ERCC 150, the ERCC 150 transfers the data signal D0 output from the logic circuit 160 in the preceding stage from an input terminal ECin to an output terminal ECout and outputs the signal D0 as a data signal Q2 to a data signal output path (a logic circuit 161 in the subsequent stage) of the main FF 110.

The TEDC 104 detects rising delay of the data signal D0; thus, when the rising delay of the signal D0 is detected, output of the TEDC 104 in the preceding stage (the logic circuit 160) is kept in the main FF 110. Thus, delay of the data signal output the logic circuit 160 in the subsequent stage can be recovered by transferring the data signal by the ERCC 150.

<Structure Example of ERCC>

The structure and operation of the ERCC 150 will be described. FIG. 11B is a circuit diagram showing a structure example of the ERCC 150. The ERCC 150 includes three transistors (Mn51, Mn52, and Mn53) and an inverter 218.

The transistor Mn51 is a switch provided between the terminal ECin the terminal ECout to connect these terminals. When the transistor Mn51 is turned on, the data signal D0 is transferred from the terminal ECin to the terminal ECout.

The transistors Mn52 and Mn53 are connected in series. A gate of the transistor Mn52 and a gate of the transistor Mn53 are connected to a terminal EN and an output of the inverter 218, respectively. The signal err is input from the terminal EN to the inverter 218. Thus, in accordance with the signal err, either one of the transistors Mn52 and Mn53 is turned on and the other is turned off.

When the signal err at H level is input to the terminal EN, the transistor Mn52 is turned on to turn the transistor Mn51 on. When the transistor Mn51 is turned on, the data signal D0 is transferred from the terminal ECin to the terminal ECout and input to the logic circuit 161.

In a period during which the signal err at L level is input to the terminal EN, the transistor Mn53 is turned on to turn the transistor Mn51 off. The data signal D0 is not transferred and consequently the data signal Q0 output from the main FF 110 is input to the logic circuit 161.

To reduce the power consumption of the ERCC 150, the off-state current of the transistors (Mn51, Mn52, and Mn53) is preferably small. For example, OS transistors may be used as the transistors (Mn51, Mn52, and Mn53).

Note that the TEDC 104 in FIG. 11A is an example in which the ERCC 150 is included in the TEDC 102. The ERCC 150 can be provided in the TEDC 101 and the TEDC 103. Note that in the case of using the ERCC 150 of FIG. 11B, the logic circuit 130 is configured so that the signal err becomes at H level when the data signal D0 is delayed. In the case of using an XOR gate circuit as the logic circuit 130, another logic circuit may be provided between an output of the logic circuit 130 and an input of the ERCC 150 (terminal EN).

This embodiment can be implemented in appropriate combination with any of the structures described in the other embodiments.

In this embodiment, a die of a processor including a TEDC is described.

(Embodiment 4)

Figure 12:
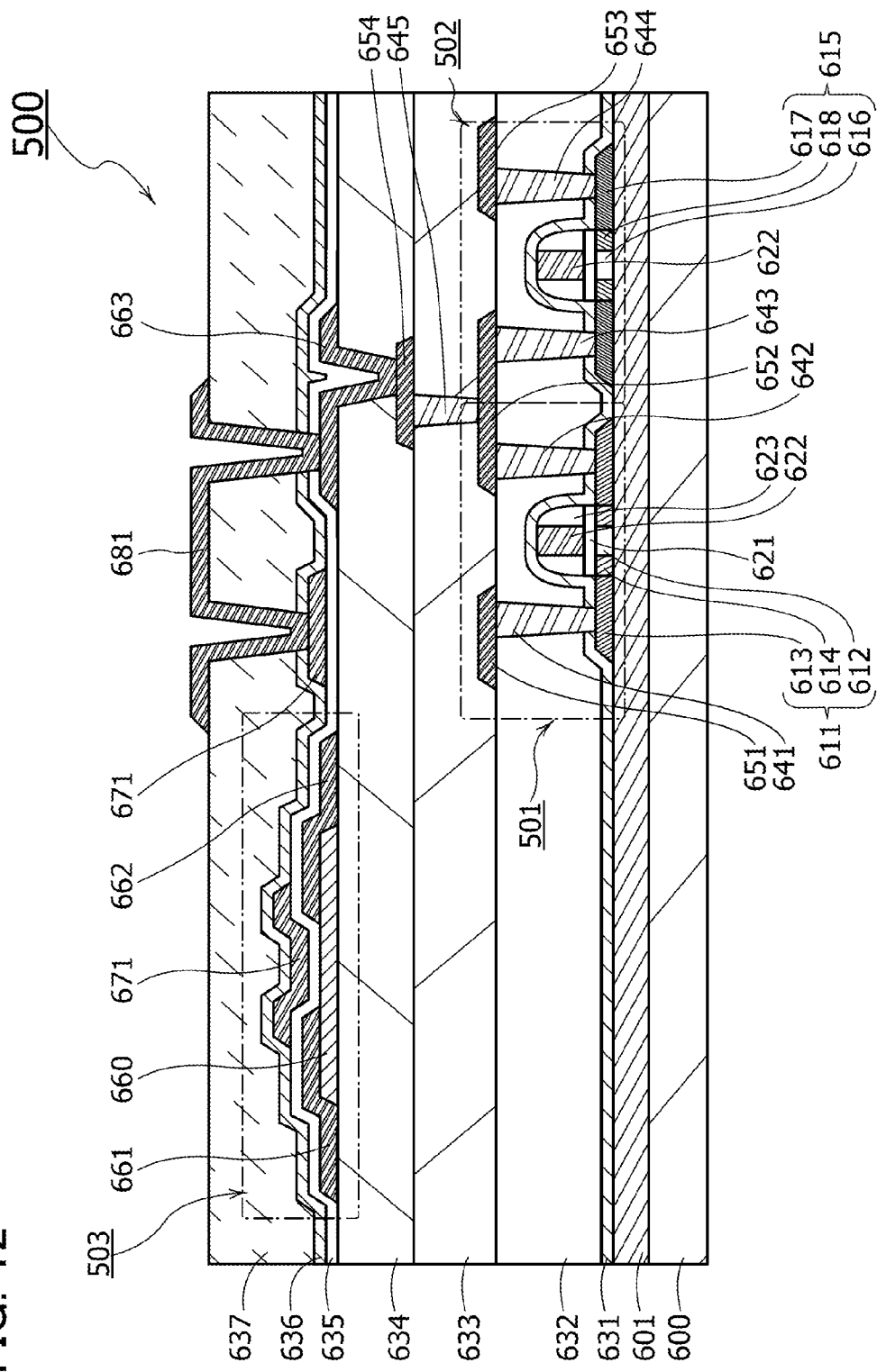
FIG. 12 is a cross-sectional view illustrating a structure example of a die included in a processor.

FIG. 12 is a cross-sectional view of an example of a layered structure of a die. As a typical example, cross-sectional structures of the RSTC 123 of the TEDC (101-104) are shown in FIG. 12. Note that FIG. 12 is not a cross-sectional view of the die taken along a specific line but a view for illustrating a layered structure of the die.

The inverter 217 of the clocked inverter 213 includes Si transistors 501 and 502. An OS transistor 503 is the transistor Mn43 serving as the switch RSW. As shown in FIG. 12, in a die 500, the OS transistor is formed over a circuit including Si transistors and consequently an increase of area overhead due to TEDCs can be suppressed.

The Si transistors 501 and 502 are formed using an SOI substrate having a single crystal Si layer. In FIG. 12, 600 denotes a single crystal Si wafer which is a support substrate of the SOI substrate; and 601, an insulating layer of the SOI substrate including an embedded oxide layer. Note that the Si transistors 501 and 502 may be formed using a bulk single crystal Si wafer.

The Si transistor 501 includes a single crystal Si layer 611, a gate insulating layer 621, and a gate wiring 622. In the single crystal Si layer 611, a channel formation region 612, a pair of p-type impurity regions 613, and a pair of p-type lightly doped regions 614 are formed. Sidewalls 623 are formed on the gate wiring 622.

The Si transistor 502 has a structure similar to that of the Si transistor 501. The Si transistor 502 includes a single crystal Si layer 615, the gate insulating layer 621, and the gate wiring 622. In the single crystal Si layer 615, a channel formation region 616, a pair of n-type impurity regions 617, and a pair of p-type lightly doped regions 618 are formed.

An insulating layer 631 is formed to cover the Si transistors 501 and 502. An insulating layer 632 is formed to cover the insulating layer 631. Electrodes 651, 652, and 653 are formed over the insulating layer 632. Openings reaching the p-type impurity regions 613 and the n-type impurity regions 617 are formed in the insulating layer 631 and the insulating layer 632. Plugs 641, 642, 643, and 644 are formed in these openings.

An insulating layer 633 is formed to cover the insulating layer 632. An electrode 654 is formed over the insulating layer 633. An opening reaching the electrode 652 is formed in the insulating layer 633. A plug 645 is formed in the opening. The electrode 652 and the electrode 654 are connected via the plug 645.

Note that a wiring functioning as a back gate of the OS transistor 503 may be formed in the same layer as the electrode 654.

An insulating layer 634 is formed to cover the insulating layer 633. The OS transistor 503 is formed over the insulating layer 634.

The OS transistor 503 includes an oxide semiconductor layer (OS layer) 660, a wiring 661, a wiring 662, an insulating layer 635, and a gate wiring 671. The insulating layer 635 serves as a gate insulating layer.

An electrode 663 is formed over the insulating layer 634. An opening reaching the electrode 654 is formed in the insulating layer 634. The electrode 663 is connected to the electrode 654 in the opening. The opening is formed before a conductive film to be the wiring and the electrodes (661, 662, and 663).

An insulating layer 636 is formed to cover the OS transistor 503. An insulating layer 637 is formed to cover the insulating layer 636. An electrode 681 is formed over the insulating layer 637. An opening reaching the electrode 663 and an opening reaching the gate wiring 671 are formed in the insulating layers 636 and 637 and the insulating layers 635-637, respectively. The electrode 681 is connected to the electrode 663 and the gate wiring 671 in the openings.

The insulating layers 631-637 can be formed with a single layer of an insulating film or a multilayer of two or more insulating films. Examples of the insulating film used for the insulating layers 631-637 include an aluminum oxide film, a magnesium oxide film, a silicon oxide film, a silicon oxynitride film, a silicon nitride oxide film, a silicon nitride film, a gallium oxide film, a germanium oxide film, a yttrium oxide film, a zirconium oxide film, a lanthanum oxide film, a neodymium oxide film, a hafnium oxide film, and a tantalum oxide film. These insulating films can be formed by a sputtering method, a CVD method, an MBE method, an ALD method, or a PLD method. As a film to be the insulating layers 631-637, a resin film of polyimide, acrylic resin, or the like can be formed.

Note that in this specification, an oxynitride refers to a substance that contains more oxygen than nitrogen, and a nitride oxide refers to a substance that contains more nitrogen than oxygen.

The gate electrodes (623 and 625), the plugs (641-646), the electrodes (651-657), the wiring and the electrodes (661-663), and the wirings (671 and 672) can be formed using a single layer of conductive film or a multilayer of two or more conductive films. Such conductive films are metal films containing aluminum, chromium, copper, silver, gold, platinum, tantalum, nickel, titanium, molybdenum, tungsten, hafnium, vanadium, niobium, manganese, magnesium, zirconium, beryllium, and the like. Such conductive films can be an alloy film containing any of these metal elements as a component, a compound film containing any of these metal elements as a component, or a polycrystalline silicon film containing an impurity element such as phosphorus, or the like.

The OS layer 660 of the OS transistor 503 can be formed of a single layer of an oxide semiconductor film or a multilayer of two or more oxide semiconductor films. The oxide semiconductor film included in the OS layer 660 is preferably formed using an oxide semiconductor containing at least one element selected from In, Ga, Sn, and Zn. As such an oxide, an In—Sn—Ga—Zn oxide, an In—Ga—Zn oxide, an In—Sn—Zn oxide, an In—Al—Zn oxide, a Sn—Ga—Zn oxide, an Al—Ga—Zn oxide, a Sn—Al—Zn oxide, an In—Zn oxide, a Sn—Zn oxide, an Al—Zn oxide, a Zn—Mg oxide, a Sn—Mg oxide, an In—Mg oxide, an In—Ga oxide, a Sn oxide, a Zn oxide, or the like can be used. In addition, the oxide may contain an element other than In, Ga, Sn, and Zn, for example, an oxide semiconductor containing $SiO_2$.

Note that, for example, an In—Ga—Zn oxide means an oxide containing In, Ga, and Zn and there is no particular limitation on the atomic ratio of In, Ga, Zn, and O.

Typical crystal structures of an oxide semiconductor film serving as the OS layer 660 are a single crystal structure, a microcrystalline structure, a polycrystalline structure, and an amorphous structure. The OS layer 660 preferably contains a c-axis aligned crystalline oxide semiconductor (CAAC-OS) film in a region functioning as a channel.

A crystal structure in an oxide semiconductor film is described below.

In the following description of a crystal structure, the term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

The amorphous oxide semiconductor film has disordered atomic arrangement and no crystalline component. A typical example of the amorphous oxide semiconductor film is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

With a transmission electron microscope (TEM), a combined analysis image (also referred to as a high-resolution TEM image) of a bright-field image and a diffraction pattern of the CAAC-OS film is observed. Consequently, a plurality of crystal parts is clearly observed. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to the sample surface, metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

According to the high-resolution plan TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

From the results of the high-resolution cross-sectional TEM image and the high-resolution plan TEM image, alignment is found in the crystal parts in the CAAC-OS film. Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 nm$^2$ or more, 5 μm$^2$ or more, or 1000 μm$^2$ or more is observed in some cases in the plan high-resolution TEM image.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film. This peak is derived from the (110) plane of the InGaZnO$_4$ crystal. Here, analysis (φ scan) is performed under conditions where the sample is rotated around a normal vector of a sample surface as an axis (φ axis) with 2q fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the high-resolution cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appears at around 31° and a peak of 2θ do not appear at around 36°.

In an OS transistor using the CAAC-OS film, change in electric characteristics of the transistor due to irradiation with visible light or ultraviolet light is small. Thus, the OS transistor has high reliability. Note that an oxide semiconductor film of a semiconductor device may be a stacked film including two or more films of an amorphous oxide semiconductor film, a microcrystalline oxide semiconductor film, and a CAAC-OS film, for example. In the case where the oxide semiconductor film has a plurality of structures, the structures can be analyzed using nanobeam electron diffraction in some cases.

This embodiment can be implemented in appropriate combination with any of the structures described in the other embodiments.

Embodiment 5

The semiconductor devices in Embodiment 1 to 3 (timing error detection circuits; TEDCs) can be used as flip-flops of a CPU, an MCU, and a programmable logic device (typically, FPGA). With the use of the semiconductor devices in Embodiment 1 to 3, various kinds of processors can be achieved.

There are processing devices of electronic devices in a wide variety of fields, such as digital signal processing, software-defined radio systems, avionic systems (electronic devices used in aircraft, such as communication systems, navigation systems, autopilot systems, and flight management systems), ASIC prototyping, medical image processing, voice recognition, encryption, bioinformatics, emulators for mechanical systems, and radio telescopes in radio astronomy.

Examples of such electronic devices are display devices, personal computers, and image reproducing devices provided with recording media (devices that read image data of recording media such as digital versatile discs (DVDs) and have displays for displaying images). Other examples of electronic devices that can include the memory management system in one embodiment of the present invention are mobile phones, game consoles including portable game consoles, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, and multifunction printers. FIGS. 13A to 13F illustrate specific examples of these electronic devices.

Figure 13A:
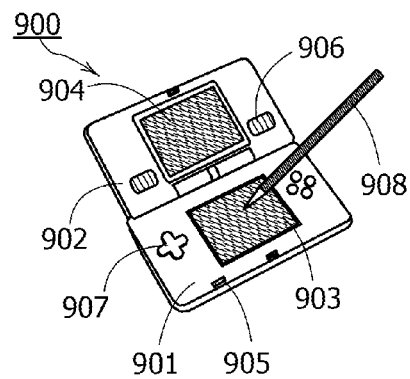
FIGS. 13A to 13F are external views each illustrating a structure example of an electronic device.

FIG. 13A is an external view illustrating a structure example of a portable game machine. The portable game machine 900 includes a housing 901, a housing 902, a display portion 903, a display portion 904, a microphone 905, a speaker 906, an operation key 907, a stylus 908, and the like.

Figure 13B:
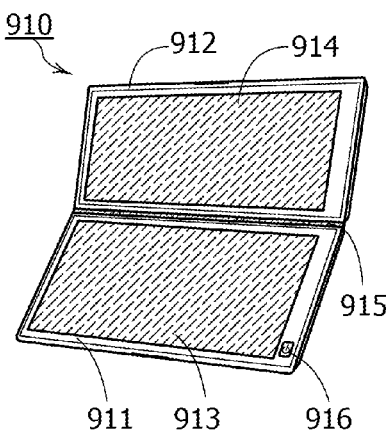

FIG. 13B is an external view illustrating a structure example of a portable information terminal. The portable information terminal 910 includes a housing 911, a housing 912, a display portion 913, a display portion 914, a joint 915, an operation key 916, and the like. The display portion 913 is provided in the housing 911, and the display portion 914 is provided in the housing 912. The housing 911 and the housing 912 are connected to each other with the joint 915, and an angle between the housing 911 and the housing 912 can be changed with the joint 915. An image on the display portion 913 may be switched depending on the angle between the housing 911 and the housing 912 at the joint 915. Note that the display portion 913 and/or the display portion 914 may be touch panels.

Figure 13C:
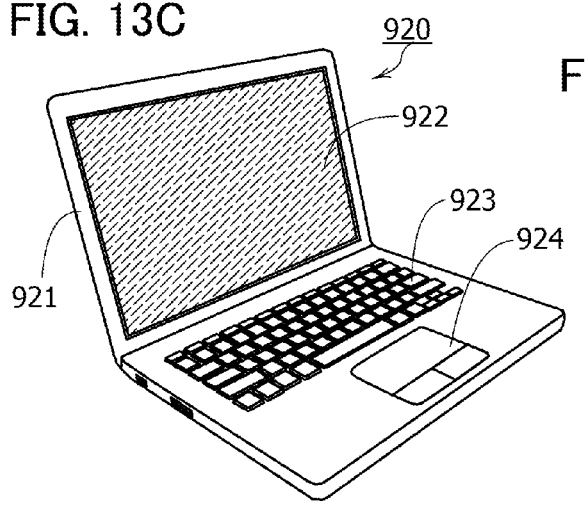

FIG. 13C is an external view illustrating a structure example of a laptop. The laptop 920 includes a housing 921, a display portion 922, a keyboard 923, a pointing device 924, and the like.

Figure 13D:
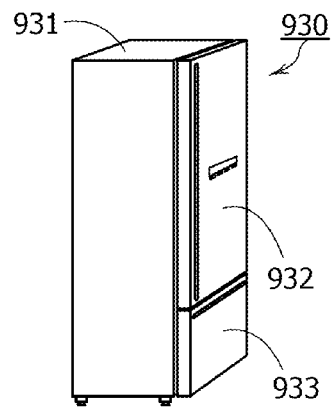

FIG. 13D is an external view illustrating a structure example of an electric refrigerator-freezer. The electric refrigerator-freezer 930 includes a housing 931, a refrigerator door 932, a freezer door 933, and the like.

Figure 13E:
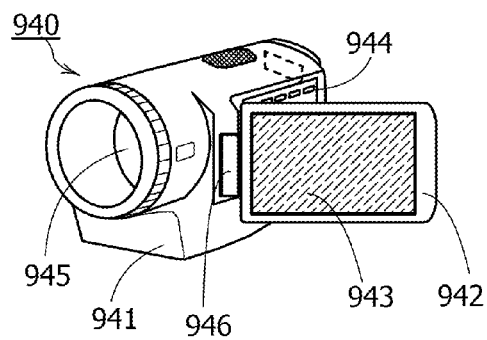

FIG. 13E is an external view illustrating a structure example of a video camera. The video camera 940 includes a housing 941, a housing 942, a display portion 943, operation keys 944, a lens 945, a joint 946, and the like. The operation keys 944 and the lens 945 are provided in the housing 941, and the display portion 943 is provided in the housing 942. The housing 941 and the housing 942 are connected to each other with the joint 946, and an angle between the housing 941 and the housing 942 can be changed with the joint 946. The direction of an image on the display portion 943 may be changed and display and non-display of an image may be switched depending on the angle between the housing 941 and the housing 942.

Figure 13F:
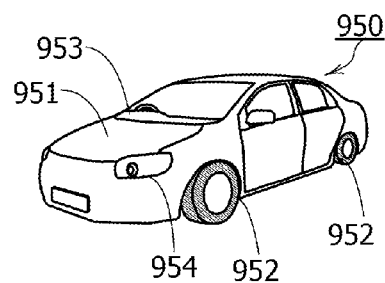

FIG. 13F is an external view illustrating a structure example of a motor vehicle. The motor vehicle 950 includes a car body 951, wheels 952, a dashboard 953, lights 954, and the like.

This implementation can be implemented in appropriate combination with any of the other implementations and the like.

This application is based on Japanese Patent Application serial no. 2013-104626 filed with Japan Patent Office on May 17, 2013, the entire contents of which are hereby incorporated by reference.

What is claimed is:

1. A semiconductor device comprising:
   a flip-flop comprising:
      a clock input terminal;
      an input terminal to which a first data signal is input; and
      an output terminal from which a second data signal is output;
   a power gating circuit for switching the flip-flop between an active state and a non-active state in accordance with the first data signal; and
   a reset circuit configured to supply a first power supply voltage to the output terminal when the flip-flop is in the non-active state,
   wherein the reset circuit comprises a first transistor,
   wherein the output terminal is electrically connected, through the first transistor, to a first wiring which is supplied with the first power supply voltage,
   wherein the first transistor is configured to be turned on and off in accordance with the first data signal, and
   wherein an off-state current of the first transistor per micrometer of channel width at room temperature is 10 zA or lower.

2. The semiconductor device according to claim 1,
   wherein the reset circuit comprises a first inverter to which the first data signal is input, and
   wherein a gate of the first transistor is electrically connected to an output terminal of the first inverter.

3. The semiconductor device according to claim 1,
   wherein the power gating circuit comprises a second transistor,
   wherein the second transistor is configured to be turned on and off in accordance with the first data signal,
   wherein the flip-flop is electrically connected, through the second transistor, to a second wiring which is supplied with a second power supply voltage, and
   wherein an off-state current of the second transistor per micrometer of channel width at room temperature is 10 zA or lower.

4. The semiconductor device according to claim 1,
   wherein the power gating circuit comprises a second transistor,
   wherein the second transistor is configured to be turned on and off in accordance with the first data signal,
   wherein the flip-flop is electrically connected, through the second transistor, to a second wiring which is supplied with a second power supply voltage, and
   wherein a channel of the second transistor comprises an oxide semiconductor.

5. A semiconductor device comprising:
   a flip-flop comprising:
      a clock input terminal;
      an input terminal to which a first data signal is input; and
      an output terminal from which a second data signal is output;
   a power gating circuit for switching the flip-flop between an active state and a non-active state in accordance with the first data signal; and
   a reset circuit configured to supply a first power supply voltage to the output terminal when the flip-flop is in the non-active state,
   wherein the reset circuit comprises a first transistor,
   wherein the output terminal is electrically connected, through the first transistor, to a first wiring which is supplied with the first power supply voltage,
   wherein the first transistor is configured to be turned on and off in accordance with the first data signal, and
   wherein a channel of the first transistor comprises an oxide semiconductor.

6. The semiconductor device according to claim 5,
   wherein the reset circuit comprises a first inverter to which the first data signal is input, and
   wherein a gate of the first transistor is electrically connected to an output terminal of the first inverter.

7. The semiconductor device according to claim 5,
   wherein the power gating circuit comprises a second transistor,
   wherein the second transistor is configured to be turned on and off in accordance with the first data signal,
   wherein the flip-flop is electrically connected, through the second transistor, to a second wiring which is supplied with a second power supply voltage, and
   wherein an off-state current of the second transistor per micrometer of channel width at room temperature is 10 zA or lower.

8. The semiconductor device according to claim 5,
   wherein the power gating circuit comprises a second transistor,
   wherein the second transistor is configured to be turned on and off in accordance with the first data signal,
   wherein the flip-flop is electrically connected, through the second transistor, to a second wiring which is supplied with a second power supply voltage, and
   wherein a channel of the second transistor comprises an oxide semiconductor.

9. A semiconductor device comprising:
a first flip-flop comprising:
- a first clock input terminal to which a first clock signal is input;
- a first input terminal to which a first data signal is input; and
- a first output terminal from which a third data signal is output;

a second flip-flop comprising:
- a second clock input terminal to which a second clock signal having the same frequency as the first clock signal and a phase different from the first clock signal is input;
- a second input terminal to which the first data signal is input; and
- a second output terminal from which a second data signal is output;

a logic circuit determining whether or not the third data signal corresponds to the second data signal and generating an error prediction signal,
a power gating circuit for switching the second flip-flop between an active state and a non-active state in accordance with the first data signal; and
a reset circuit configured to supply a first power supply voltage to the second output terminal when the second flip-flop is in the non-active state,
wherein the reset circuit comprises a first transistor,
wherein the second output terminal is electrically connected, through the first transistor, to a first wiring which is supplied with the first power supply voltage,
wherein the first transistor is configured to be turned on and off in accordance with the first data signal, and
wherein a channel of the first transistor comprises an oxide semiconductor.

10. The semiconductor device according to claim 9,
wherein the reset circuit comprises a first inverter to which the first data signal is input, and
wherein a gate of the first transistor is electrically connected to an output terminal of the first inverter.

11. The semiconductor device according to claim 9,
wherein the power gating circuit comprises a second transistor,
wherein the second transistor is configured to be turned on and off in accordance with the first data signal,
wherein the second flip-flop is electrically connected, through the second transistor, to a second wiring which is supplied with a second power supply voltage, and
wherein a channel of the second transistor comprises an oxide semiconductor.

12. The semiconductor device according to claim 9, further comprising a delay circuit delaying the first clock signal to generate the second clock signal which is delayed from the first clock signal.

13. A semiconductor device according to claim 9, further comprising a correction circuit which corrects the third data signal in accordance with the error prediction signal.

14. A semiconductor device according to claim 13, wherein the correction circuit comprises a third transistor comprising an oxide semiconductor.

\* \* \* \* \*